(12) United States Patent
Bawolek et al.

(10) Patent No.: US 6,771,314 B1
(45) Date of Patent: *Aug. 3, 2004

(54) ORANGE-GREEN-BLUE (OGB) COLOR SYSTEM FOR DIGITAL IMAGE SENSOR APPLICATIONS

(75) Inventors: Edward J. Bawolek, Chandler, AZ (US); Zong-Fu Li, Gilbert, AZ (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1062 days.

(21) Appl. No.: 09/052,867

(22) Filed: Mar. 31, 1998

(51) Int. Cl.$^7$ ............................................... H04N 5/335
(52) U.S. Cl. ..................... 348/272; 348/280; 348/222.1
(58) Field of Search ................................. 348/207, 272, 348/273, 274, 275, 276, 277, 280, 222, 360, 207.99, 222.1; 428/411.1; H04N 5/335

(56) References Cited

U.S. PATENT DOCUMENTS 3,971,065 A 7/1976 Bayer
5,063,439 A * 11/1991 Tabei .......................... 348/272
5,540,998 A * 7/1996 Yamada et al. ........... 428/411.1

OTHER PUBLICATIONS

Television hand Book by K. Blair Benson, pp. 2. 17, 1992.*

"Single–Chip Color Camera Using a Frame Transfer CCF," Aschwanden, F., Gale, M. T., Kieffer, P., Knop, K., IEEE Trans. Electron Devices, vol. ED–32, no. 8, pp. 1396–1401.

"MOS Solid–State Imager," Izumi, A., Mayama, K., Hitachi Review, vol. 32, No. 3 (1983).

* cited by examiner

*Primary Examiner*—Tuan Ho
(74) *Attorney, Agent, or Firm*—Blakely, Sokoloff, Taylor & Zafman LLP

(57) ABSTRACT

A color imaging device comprised of a plurality of light selective elements. The light selective elements include a first light selective element selective to light having a wavelength corresponding to the Orange region of the spectrum, a second light selective element selective to light having a wavelength corresponding to the Green region of the spectrum, and a third light selective element sensitive to light having a wavelength corresponding to the Blue region of the spectrum.

16 Claims, 10 Drawing Sheets

| O | G | O | G | O | G | O | G | O | G |
|---|---|---|---|---|---|---|---|---|---|
| G | B | G | B | G | B | G | B | G | B |
| O | G | O | G | O | G | O | G | O | G |
| G | B | G | B | G | B | G | B | G | B |
| O | G | O | G | O | G | O | G | O | G |
| G | B | G | B | G | B | G | B | G | B |
| O | G | O | G | O | G | O | G | O | G |
| G | B | G | B | G | B | G | B | G | B |

Fig. 3b

ORANGE-GREEN-BLUE (OGB) COLOR SYSTEM FOR DIGITAL IMAGE SENSOR APPLICATIONS

BACKGROUND OF THE INVENTION

1. Field of the Invention

The invention relates to imaging sensors and more particularly to a color system for imaging sensors.

2. Description of Related Art

Digital color imaging devices are routinely built by overlaying color filter arrays (CFA) on a charge coupled device (CCD) or complimentary metal oxide semiconductor (CMOS) imagers. In general, a CFA is made of three or more color channels that are each selective to visible light and therefore limit the light that is incident on an imaging sensor. The color filter channels selectively allow light corresponding to a predetermined range of the visible spectrum to pass through a channel to the imaging sensor. Thus, a CFA allows light having the color content of the imaged scene to be estimated by appropriate operation of the device on the responses of the camera colored channels. Commonly used color schemes include red-green-blue (RGB), cyan-magenta-yellow (CMY), and cyan-magenta-yellow-green (CMYG). Color schemes employing a "white" or uncolored pixel, have also been reported. These include a cyan-white-yellow-green (CWYG) color system reported by Hitachi Ltd., Mobara Works of Mobara, Japan and a cyan-white-green (CWG) system reported by RCA Laboratories of Zurich, Switzerland.

The considerations for any color system generally include the color fidelity, the signal-to-noise ratio of the imaging system, and the manufacturability of the sensor. Color fidelity deals with the capability of the color system to accurately measure or reproduce the color of the imaged scene, i.e. the ability to render a calorimetrically accurate image. The signal-to-noise ratio of the imaging system, e.g., camera system deals with the number of signals delivered by the sensor to the system that are attributable to photons and thus the imaged scene. Finally, the manufacturability of the sensor is concerned with the various processing steps, costs, and yield in the manufacturing of a particular sensor for an imaging system.

Color fidelity is a consequence of the CFA characteristics. The goal of any color system is to match or predict the human eye response. A color system is successful if it can match the color sensors of the eye or if the system is made up of colors that have enough difference between them over the visible spectrum that, through a mathematical manipulation, the system can effectively predict the human eye response. It is to be appreciated that sophisticated mathematics can be used to adapt any color combination to the human eye response. However, sophisticated mathematics are not ordinarily used because of the degree of mathematics required at each of the thousands of pixels of a given image, i.e., the time factor, and the concern of increasing or multiplying the amount of noise present in any sensor. Thus, for simplicity and practicality, color systems selected based on their ability to match the human eye response through a mathematical manipulation are generally limited to such color systems that allow such manipulation to occur via a 3×3 matrix transformation of the numerical data as opposed to larger matrix transformations.

As mentioned above, no image is free of noise. In a digital sensor, photons strike the sensor and the sensor converts the photons, generally through the use of a photodiode or similar device, to electrons. However, as yet, electrical sensors are not perfect and some electrons pass through the diodes as leakage or dark current that are not representative of the photons of the imaged scene. Thus, when the final signal of the imaged scene is collected, a leakage or dark current is present and it is difficult to distinguish an electron originating from a photon from an electron that is attributable to leakage or dark current. The leakage or dark current is characterized as a source of noise. There are other sources of noise, including a source of noise resulting from a quantization error of reducing the information content of a signal to its digital value.

The above sources of noise allow an evaluation of the signal-to-noise ratio of a color system. An RGB system, for example, divides the range of the visible spectrum that a human eye can see (approximately 400–700 nanometers) into three colors based on their frequency and wave lengths, RGB. Each Red, Green, or Blue filter passes about one-third of the available light through its color channel. Therefore, each color channel ignores two-thirds of the available photons for an imaged scene. Thus, two-thirds of the light that is incident on the filter goes to waste and is never used to create a signal in the camera. The amount of noise attributable to the sensor can be reduced if each color channel is exposed to more of the available photons.

A CMY color scheme or color system is known as a complimentary set of colors. By complimentary, the individual colors Cyan, Magenta and Yellow, provide a broader spectrum than either Red, Green, or Blue. Cyan is a combination of blue and green. Magenta is a combination of blue and red. Yellow is a combination of green and red. In effect, each Cyan, Magenta, or Yellow passes two-thirds of the available light of an imaged scene. Only one-third of the photons are ignored on a given color channel. This would appear to decrease the noise by a factor of two over the RGB system, since twice as much light is seen by the sensors as an RGB system. However, the reduction in noise benefit must be reduced somewhat by the mathematical manipulation of the color channels to predict the human eye response. In other words, the complimentary scheme CMY requires more mathematical manipulation than the non-complimentary RGB color scheme and, because there is still some noise present in the captured image, that noise is increased through the mathematical manipulation.

An RGB color scheme is often selected for ease of signal processing and generally good color fidelity. CMY and CMYG systems are often employed where it is desirable to improve the light sensitivity of the camera system by maximizing the integrated transmittance of the color filters over the visible spectrum. Because additional signal processing is necessary to recover an RGB color signal suitable, for example, to display on a computer monitor, from CMY or CMYK systems, the color fidelity is sometimes compromised in favor of an improved signal-to-noise ratio.

BRIEF SUMMARY OF THE INVENTION

The invention relates to a color imaging device. The color imaging device is comprised of a plurality of light selective elements. The light selective elements include a first light selective element selective to light having a wavelength corresponding to the Orange region of the spectrum, a second light selective element selective to light having a wavelength corresponding to the Green region of the spectrum, and a third light selective element sensitive to light having a wavelength corresponding to the Blue region of the spectrum.

BRIEF DESCRIPTION OF THE DRAWINGS

FIG. 3b shows one embodiment of a tiling pattern for the OGB CFA material in accordance with the invention.

DETAILED DESCRIPTION OF THE INVENTION

The invention relates to a color imaging device comprised of an array of light selective elements. The light selective elements include a first light selective element selective to light having a wavelength corresponding to the Orange region of the spectrum. The second light selective element is selective to light having a wavelength corresponding to the Green region of the spectrum. A third light selective element is selective to light having a wavelength corresponding to the Blue region of the spectrum. The Orange-Green-blue (OGB) system disclosed in the invention provides excellent color fidelity, comparable to or exceeding the performance of RGB color systems. Compared to an RGB color system, the OGB system provides an improved signal-to-noise ratio reflected in a more accurate prediction of the human eye color response.

The invention also relates to a color-imaging sensor having an array of OGB light selective elements. In one embodiment, the light selective elements of the invention use pigments as colorants and a solvent mixture suitable for lithographic patterning on image sensing circuits. This material formulation has superior stability to degradation by heat or light as compared with similar dyed materials conventionally used in prior art systems.

The manufacturability of the OGB-based imaging device can be easily retrofit into conventional RGB systems or an RGB process line. This allows a filtering system with improved color fidelity, improved signal to noise ratio, and improved durability to be used in a conventional RGB process line.

Figure 1A:
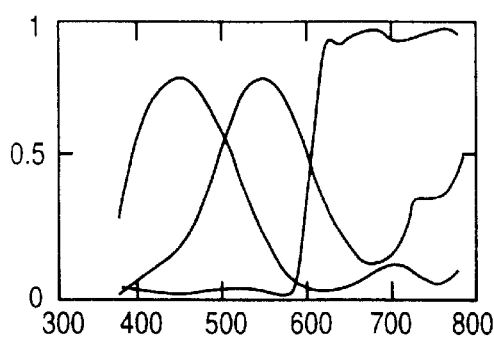
FIG. 1a shows the transmittance characteristics of a conventional RGB CFA material.

FIG. 1a presents the transmittance characteristics of a conventional RGB CFA material. As noted above, the Red, Green, and Blue filter materials have different transmittance characteristics between them that span the visible spectrum, i.e., approximately 400–700 nanometers. FIG. 1a shows a Red CFA material having a peak transmissivity at about 600 nanometers, a Green CFA material having a peak transmissivity at about 550 nanometers, and a Blue CFA material having a peak transmissivity at about 450 nanometers.

Figure 1B:
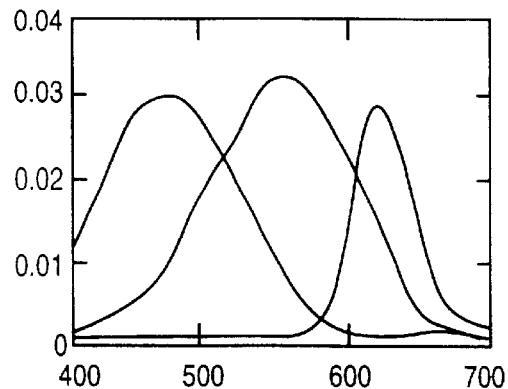
FIG. 1b shows the relative response characteristics of a camera system based on a conventional RGB CFA.

FIG. 1b presents the response characteristics of a camera system based on a conventional RGB CFA material. While FIG. 1a considered the color channel filter material in isolation, FIG. 1b looks at the color channel in terms of the camera system as a whole. FIG. 1b shows the relative response characteristics of the three camera color channels after combining the characteristics of the CFA material with the sensor responsivity and the characteristics of an infrared blocking filter designed to cut-off wavelengths longer than approximately 700 nanometers. The values shown are arbitrary units.

Figure 1C:
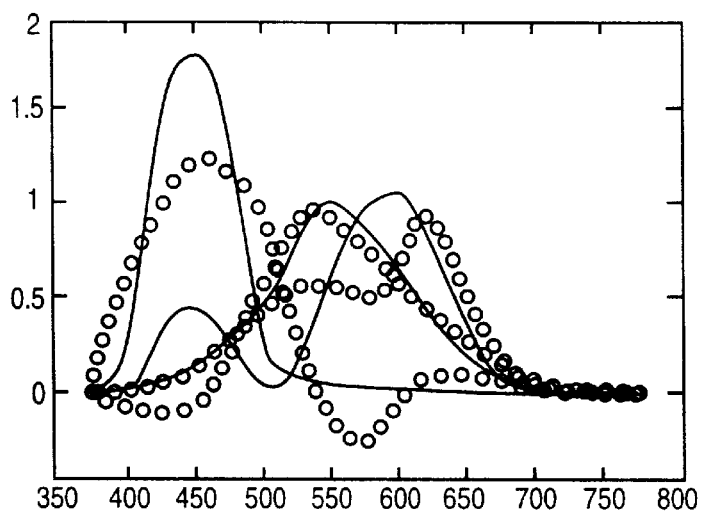
FIG. 1c shows the response characteristics of a camera system after conversion into a target color space by means of a 3×3 matrix transformation.

FIG. 1c shows the same camera system based on RGB CFA material after the system is converted into CIE XYZ target color space by means of a 3×3 matrix. "CIE" stands for the Commission Internationale de l'Éclirage (International Commission on Illumination). CIE XYZ represents an industry standardized method of defining color space numerically.

FIG. 1c shows the ideal behavior of a camera system in solid lines. FIG. 1c shows the camera system of the RGB color system after conversion into CIE XYZ color space in dotted lines. It is to be noted that the Green matches closest to the ideal behavior (i.e., closet to the Y color channel), while the Blue and Red are skewed from the X and Z channels, respectively. Ideally, the system response after 3×3 matrix transformation would exactly match the ideal characteristics shown. If this match were achieved, the camera system would have the same color discrimination capability as a human being. In other words, the camera system would be able to recognize any visible color without error. Because the actual match between the system response and the ideal curves is not exact, the camera system will have some potential errors in color recognition. However, most colors in the natural world are broadly distributed over the visible spectrum. Therefore, regions where the camera system under-responds to a given color tend to be compensated for by regions of over-response. Errors tend to be "averaged out." The result is that a camera system having, for example, an RGB color system, can still produce satisfactory representations of most colors giving a satisfactory "user experience."

Figure 2A:
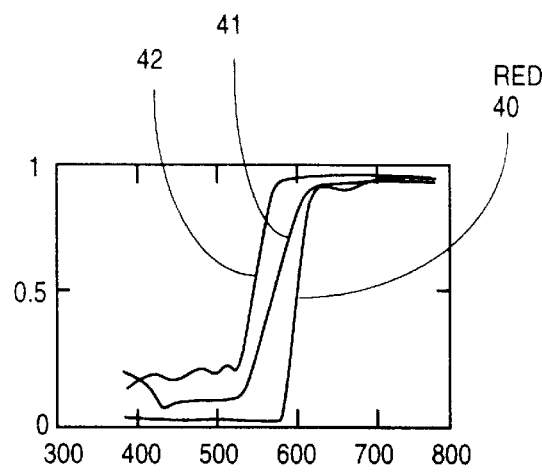
FIG. 2a shows a comparison of transmittance characteristics of Red CFA material with predicted performance of two Orange CFA materials based on PO42 and PO43 pigments, respectively.

FIG. 2a shows a comparison of the transmittance characteristics of Red CFA material 40 with the predicted performance of two Orange CFA materials, 41 and 42, respectively. A reference point for evaluating each of the CFA materials is the point at which the filter material transmits half of the available light, i.e., the 50% cut off point. In FIG. 2a, Red CFA material 40 has a 50% cut off at approximately 590 nanometers. Orange CFA material 41 is a polymer having a pigment represented by standardized color designation PO42 orange CFA material 41 yields a 50% cut off at approximately 570 nanometers. Orange CFA material 42 is a polymer having a pigment represented by standardized color designation PO43. Orange CFA material 42 yields a 50% cut off of approximately 530 nanometers.

As noted above, in one embodiment, the Orange CFA material is pigmented polymers. Pigmented polymers are chosen because of their superior stability to degradation by heat or light as compared with similar dyed materials. Orange pigments PO42 and PO43, for example, were chosen based on several considerations. First, individually or combined, the pigments provide exceptional optical fidelity in color filter material. Secondly, safety concerns (e.g., toxicity, degradation, etc.) permit the use of these pigment/polymer mixtures. Third, pigments PO42 and/or PO43 are disburseable in a polymer matrix and can serve as CFA material. The materials are also compatible with solvent chemistries that are typically used in CFA polymers. Finally, the thermal stability of both PO42 and PO43 pigments at temperatures as high as 250° C. makes them desirable since imaging devices may be built with reflow solder techniques that expose the sensor and any overlayed CFA material to temperatures over 250° C.

Figure 2B:
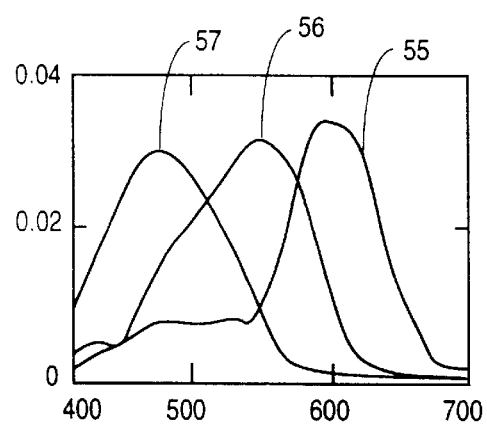
FIG. 2b shows the response characteristics of a camera system based on an OGB CFA material system in accordance with an embodiment of the invention.

FIG. 2b shows the response characteristics of a camera system based on an OGB CFA material. In this case, Green color channel 56 and Blue color channel 57 remain the same as the RGB camera system illustrated in FIG. 1b, and an Orange color channel 55 differs from the Red color channel of FIG. 2b.

Figure 2C:
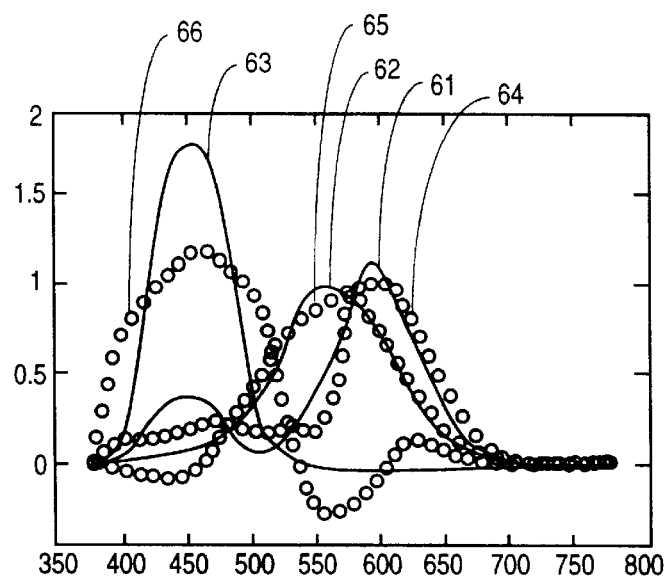
FIG. 2c shows the response characteristics of a camera system based on OGB CFA materials after conversion into a target color space by means of a 3×3 matrix transformation.

FIG. 2c represents a camera response of a camera system based on OGB CFA material after conversion of the signal into CIE XYZ color space by means of a 3×3 matrix transformation. The solid lines in FIG. 2c represent the ideal behavior: X is represented by line 61, Y by line 62, and Z by line 63. The dotted lines represent the response of the camera system based on OGB CFA material: X is represented by line 64, Y by line 65, and z by line 66. When comparing FIG. 2c to FIG. 1c, it is clear that OGB CFA material also deviates from the ideal response. However, analysis of the system color response indicates that excellent color fidelity is possible with these characteristics. For example, there is little skew in the ideal X line 61 and the OGB camera system X line 64. One way to interpret this is to say that the color errors of the camera system are improved, i.e., the OGB camera system more closely mimics the human eye than the RGB camera system of FIG. 1b. The signal-to-noise ratio of the OGB camera system is also improved over the RGB camera system since more of the signals from the sensor are attributable to photons as evidenced by the improved prediction of the human eye response. Stated a second way, the signal to noise ratio is improved because Orange channel 55 in FIG. 2b captures a greater portion of the available visible spectrum than does the corresponding Red channel shown in FIG. 1b. This is immediately evident by comparing the relative widths of the respective spectral distributions.

The following calculation method was used to convert the response characteristics shown in FIG. 2b into the CIE XYZ color space response shown in FIG. 2c:

$$\begin{bmatrix} X \\ Y \\ Z \end{bmatrix} = [Mat\ 3 \times 3] \begin{bmatrix} O \\ G \\ B \end{bmatrix}.$$

The 3×3 matrix values calculated are as follows:

$$[Matrix\ 3 \times 3] = \begin{bmatrix} 1.022 & -0.124 & 0.067 \\ 0.277 & 1.06 & -0.337 \\ 0.280 & -0.788 & 1.69 \end{bmatrix}$$

The following tables represent the numerical estimate of the color reproduction errors for an RGB camera system (Table 1) and an OGB camera system in accordance with an embodiment of the invention (Table 2). The numbers presented are in CIE Lab units. CIE Lab represents a second standardized color space. The values in the tables represent the error of the predicted color from the color system relative to a Macbeth Colorchecker® produced by Gretag Macbeth Corporation of New Windsor, N.Y. The Lab values are in one-to-one correspondence to the positions of colors on a Macbeth Colorchecker®. The upper left corner corresponds to the Macbeth color labeled "Dark Skin"; the lower right corner corresponds to the Macbeth color labeled "Black." The larger the number relative for a particular color, the greater the error of the color from the corresponding color on the Macbeth Colorchecker®.

$$\Delta E_{Lab} = \begin{bmatrix} 1.4 & 1.2 & 3.3 & 6.1 & 0.5 & 6.6 \\ 12.6 & 6.7 & 1.6 & 5.6 & 7.0 & 8.6 \\ 10.5 & 9.9 & 10.5 & 0.5 & 3.7 & 5.6 \\ 1.5 & 1.4 & 2.0 & 1.3 & 1.6 & 0.5 \end{bmatrix}$$

Table 1: Color Reproduction Errors for RGB Color System $$\Delta E_{Lab} = \begin{bmatrix} 1.4 & 1.1 & 0.6 & 0.7 & 1.1 & 1.8 \\ 8.4 & 1.1 & 2.1 & 2.9 & 2.7 & 7.9 \\ 5.5 & 3.8 & 8.9 & 2.6 & 1.9 & 0.6 \\ 0.9 & 0.5 & 0.6 & 1.0 & 0.5 & 0.5 \end{bmatrix}$$

Table 2: Color Reproduction Errors for OGB Color System

As can be seen from a comparison of Table 1 and Table 2, in terms of the CIE Lab units, the reproduction errors for an OGB color system are generally improved over the color errors of the RGB camera system. The improvement in reproduction errors correlates into a color system having an improved color fidelity ratio over a traditional RGB camera system.

Figure 3A:
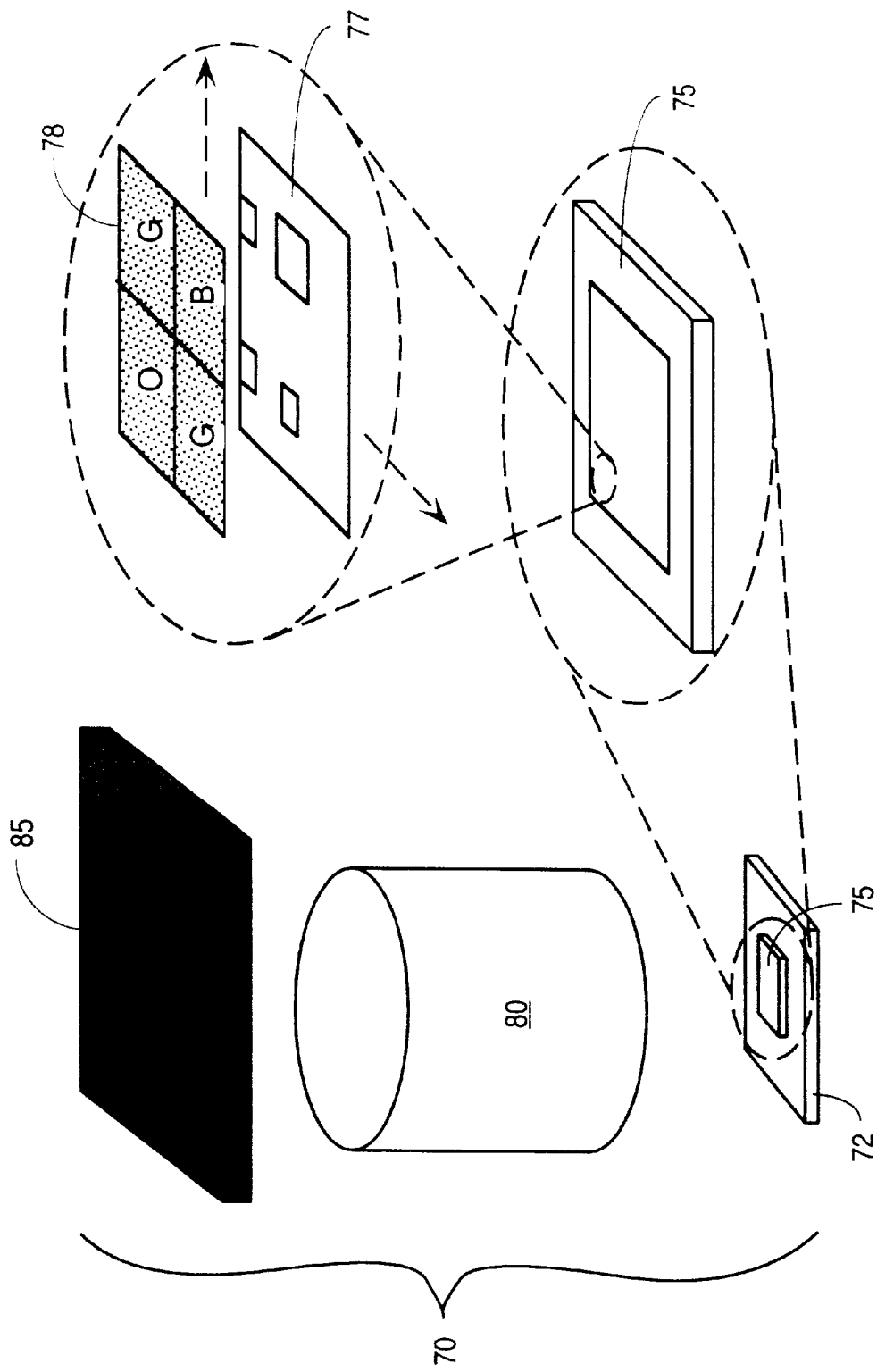
FIG. 3a shows a diagrammatic view of a portion of an imaging system in accordance with one embodiment of the invention.

FIG. 3a shows a diagrammatic view of a portion of an imaging system in accordance with an embodiment of the invention. Imaging system 70 includes image sensor 75 in package 72, such as for example a plastic package. Overlying image sensor 75 is lens assembly 80. Infrared blocking filter 85 overlies the lens to inhibit infrared light from striking sensor 75.

In the insert of FIG. 3a is a magnified view of sensor 75. A magnified view of sensor 75 in turn shows some additional sensor components. Included within the components shown in FIG. 3a is uppermost metal layer 77 having illustrative openings intended to modulate pixel responsivity. Overlying metal layer 77 is an array or mosaic of CFA material 78 covering, in this instance, four different pixels of sensor 75: one Orange, two Green, and one Blue. The array or mosaic represents a tiling pattern for the CFA material.

FIG. 3b shows one embodiment of a tiling pattern for an OGB color system over a sensor, such as a digital camera sensor, in accordance with the invention. The tiling pattern provides a substantially rectangular repeating array made up of two Green CFA material areas for each of Orange and Blue CFA material. In the embodiment shown, Green CFA material areas are disposed diagonally in a rectangular array or mosaic. The Orange and Blue CFA material areas alternate with the Green CFA material area across each row and column of the array or mosaic. The pattern is similar to the Bayer tiling pattern utilized in RGB camera systems.

The use of a tiling pattern that utilizes two Green CFA material channels for each of Orange and Blue CFA material channels provides a luminance or lightness/darkness benefit. The typical human visual system is more sensitive to errors in lightness than errors in color. The human visual color system will accept variations in hue or saturation but it is less tolerant to errors in lightness or darkness, i.e., luminance. Since the visual system is keyed to lightness and darkness, the tiling pattern illustrated in FIG. 3 is selected to improve the accuracy of the luminance or lightness/brightness. In the ordinary human eye response, light having a wavelength associated with the Green region of the visible spectrum is keyed to luminance or lightness/brightness. Accordingly, in the tiling pattern described, fully half of the array is devoted to lightness/brightness, making an image reproduced by the color imaging system, such as for example a camera, acceptable to the human visual system.

Figure 4A:
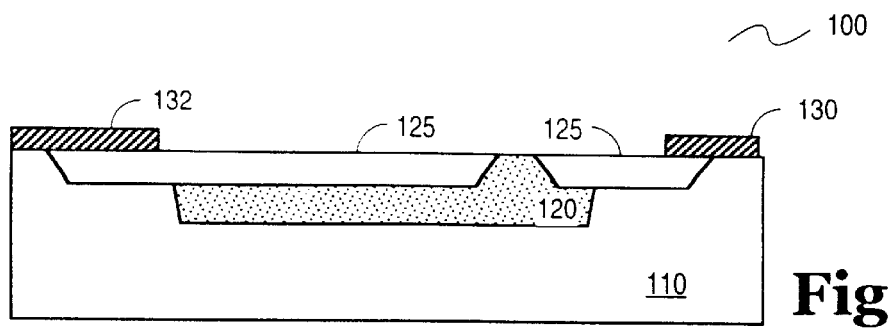
FIG. 4a shows a cross-sectional side view of a pixel after fabrication of active devices and a photosensing portion in accordance with an embodiment of the invention.

FIGS. 4a–4l illustrate cross-sectional side views one embodiment of a process of forming a pixel in an OGB color pixel array. In this example, an image sensing device is a semiconductor chip made up of a number of pixels, each pixel capable of absorbing light. FIG. 4a illustrates a pixel of the invention after fabrication of active devices by conventional processing methods. Pixel 100 is formed of a semiconductor substrate, such as for example an n-type silicon substrate having a $p^+$-type epitaxial layer 110 and an $n^+$-type region 120 in $p^+$-type epitaxial layer 110. The $n^+$-type/$p^+$-type interface forms a photosensing portion or photodiode portion of the pixel. In general, each pixel contains a photosensing portion such as a photodiode, and other pixel circuitry. FIG. 4a shows other elements, including trench oxide 125 and polysilicon layers 130 and 132.

Figure 4B:
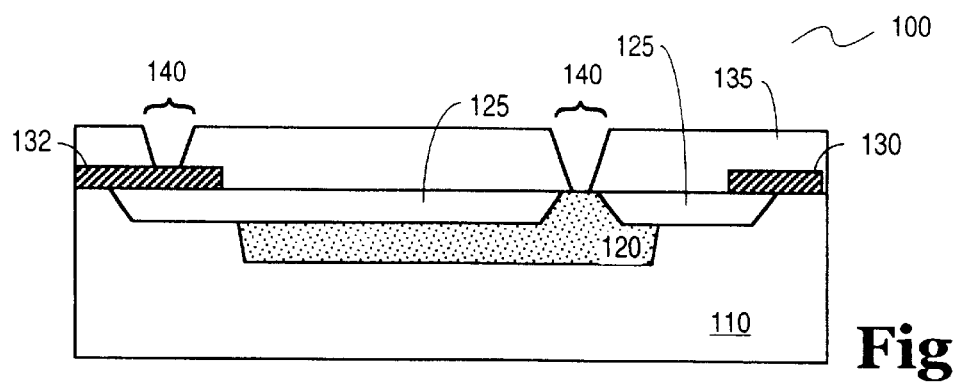
FIG. 4b shows the pixel of FIG. 4a after the subsequent processing step of depositing and patterning a first dielectric layer over the active devices.

FIG. 4b illustrates the pixel of FIG. 4a after the subsequent processing steps of depositing and patterning a first dielectric layer or ILD0 layer 135. Once deposited and formed, ILD0 layer 135 is patterned and etched to form vias 140 (to n-well 120) and 142 (to polysilicon layer 132). In one example, via lithography involves coating ILD0 layer 135 with a photoresist material, exposing the photoresist material, and removing the unexposed photoresist in a developing step. Vias 140 and 142 are then etched with a conventional etchant and the photoresist mask material removed. Via lithography and etch are well known in the art and employ conventional processing steps and processing equipment.

Figure 4C:
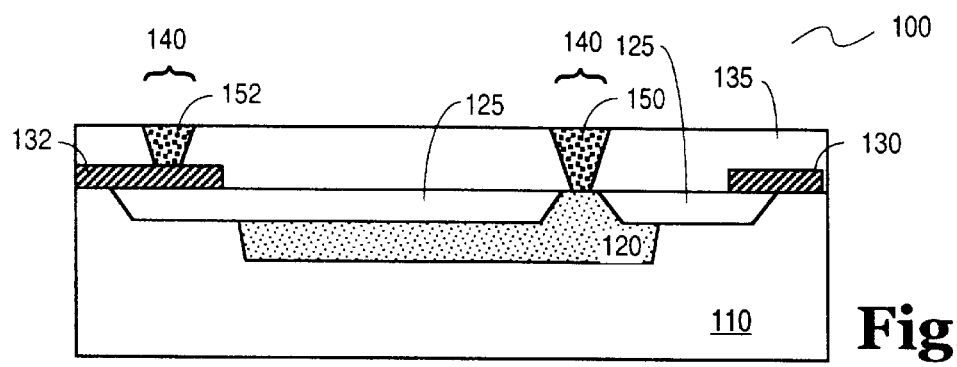
FIG. 4c shows the pixel of FIG. 4a after the subsequent processing step of depositing and planarizing a contact through the first layer of dielectric material.

FIG. 4c shows the pixel after the subsequent processing steps of depositing and planarizing a metal to vias 140 and 142 to form contacts 150 and 152, respectively. In one embodiment, the metal is a chemical vapor deposited (CVD) tungsten. The tungsten is planarized, for example, by a conventional chemical-mechanical polish.

Figure 4D:
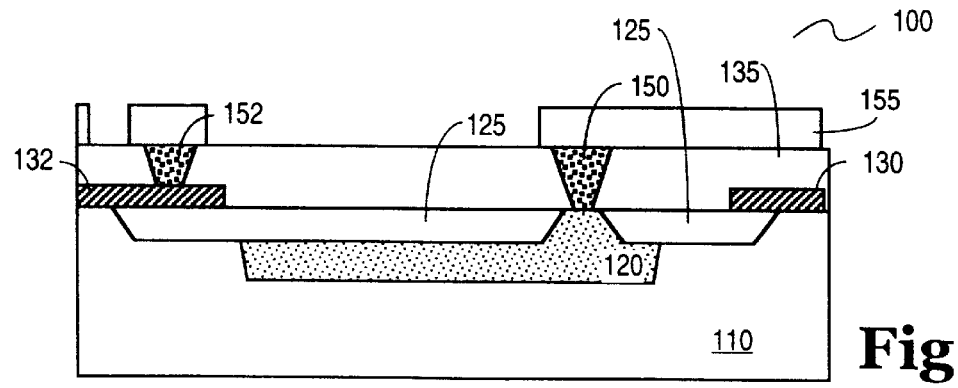
FIG. 4d shows the pixel of FIG. 4a after the subsequent processing step of depositing and patterning a first metal layer over the first dielectric layer.

FIG. 4d shows the pixel after the subsequent processing step of depositing and patterning a first metal layer 155 over ILD0 layer 135, to contacts 150 and 152, respectively. First metal layer 155 is, for example, an aluminum or aluminum alloy. First metal layer 155 is deposited and patterned by conventional processing steps and processing equipment.

Figure 4E:
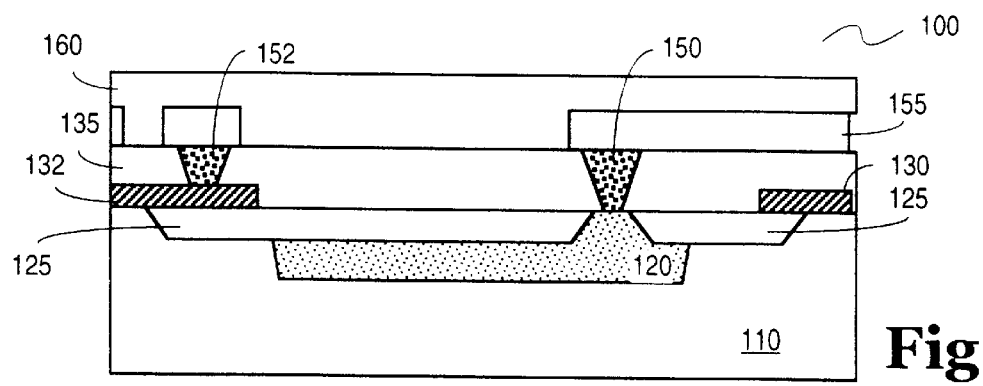
FIG. 4e shows the pixel of FIG. 4a after the subsequent processing step of depositing and patterning a second dielectric layer.

FIG. 4e shows the pixel after the subsequent processing step of depositing and patterning a second dielectric layer or ILD1 layer 160 over first metal layer 155 to electrically isolate first metal layer 155 from additional conductive materials. At this time, ILD1 layer 160 is planarized and openings are made where desired to first metal layer 155. Contacts, such as for example CVD tungsten contacts, are then formed to first metal layer 155 (contacts not shown in this cross-section). The planarizing, lithography, etching, and contact deposition to first metal layer 155 is not shown, but would follow conventional processing steps and processing equipment as noted above with similar steps.

Figure 4F:
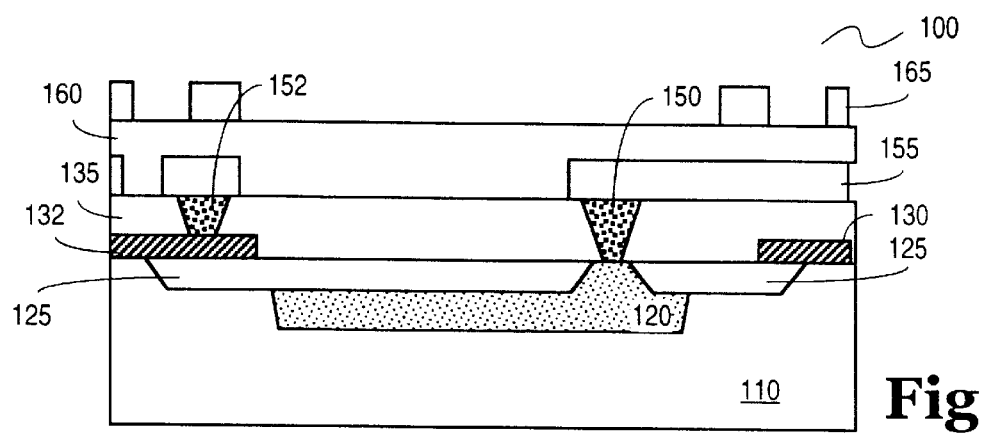
FIG. 4f shows the pixel of FIG. 4a after the subsequent processing step of depositing and patterning a second metal layer over the second/dielectric layer.
Figure 4G:
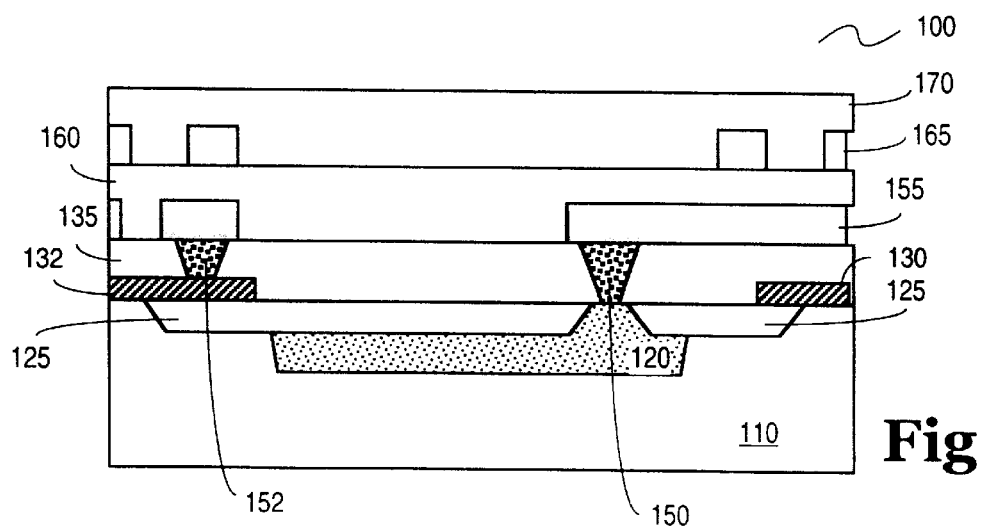
FIG. 4g shows the pixel of FIG. 4a after the subsequent step of depositing and patterning a third layer of dielectric.

FIG. 4f shows the pixel after the subsequent processing step of depositing and patterning a second metal layer 165 over ILD1 layer 160. Second metal layer 165 is typically an aluminum or aluminum alloy layer similar to first metal layer 155. Next, second metal layer 165 is electrically isolated by a third dielectric layer or ILD2 layer 170 as shown in FIG. 4g. Next, ILD2 layer 170 is planarized, such as for example by a chemical mechanical polish, then openings are etched through ILD2 layer 170 to, for example, second metal layer 165 and contacts, such as for example, CVD tungsten contacts, are deposited in the vias. The polishing, lithography, etching, and contact deposition and polish steps are not shown.

Figure 4H:
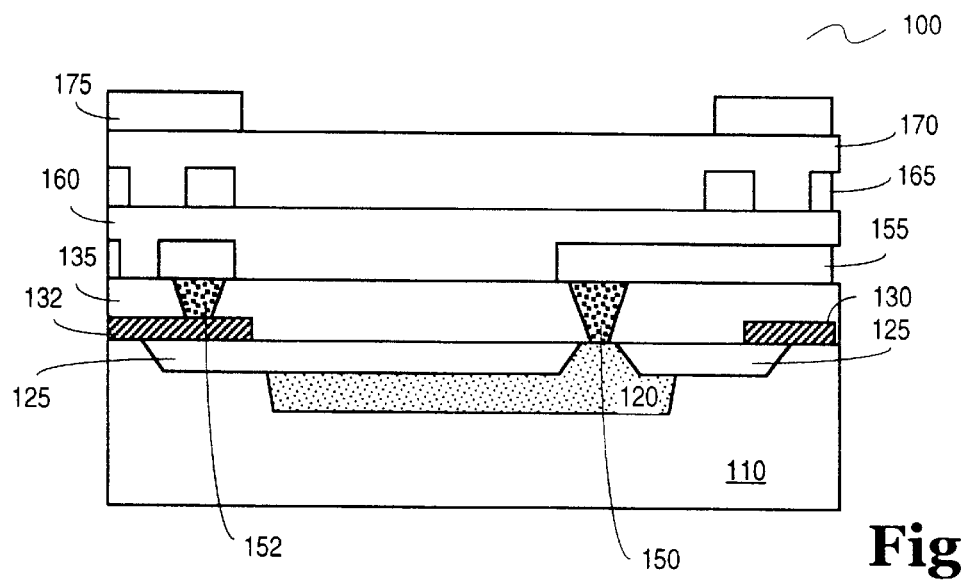
FIG. 4h shows the pixel of FIG. 4a after the subsequent processing step of depositing and patterning a third metal layer over the third dielectric layer.
Figure 4I:
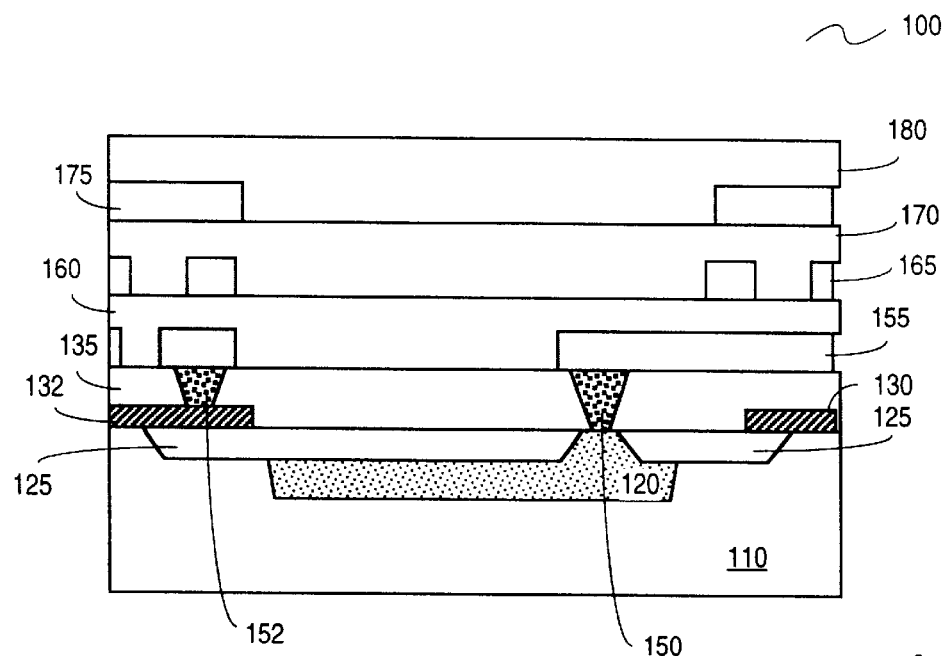
FIG. 4i shows the pixel of FIG. 4a after the subsequent processing step of depositing and patterning a fourth dielectric layer over the third metal layer.

FIG. 4h shows the pixel after the subsequent processing step of depositing third metal layer 175 over planarized ILD2 layer 170. This is followed by the deposition of a fourth dielectric layer or ILD3 layer 180 over the patterned third metal layer 175. ILD3 layer 180 is planarized and vias or openings are made to, for example, third metal layer 175. The pixel after ILD3 layer 180 is planarized as shown in FIG. 4i. Contacts, such as for example CVD tungsten contacts, are then formed to third metal layer 175 (vias and contacts not shown in this cross-section). The steps of polishing, lithography, etching, and contact deposition and polish are not shown.

Figure 4J:
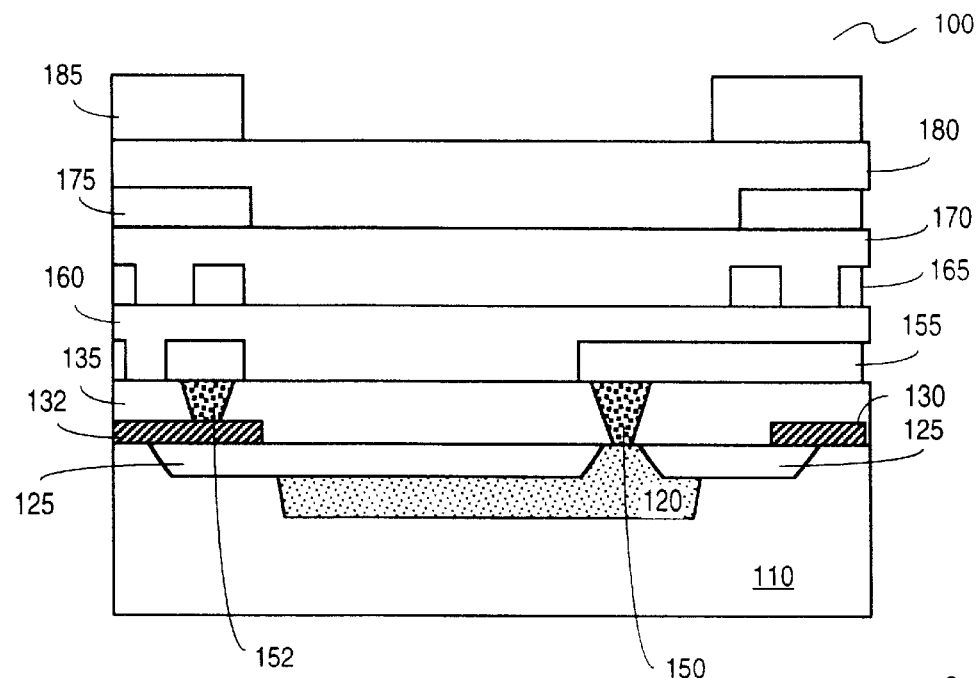
FIG. 4j shows the pixel of FIG. 4a after the subsequent processing step of depositing and patterning a fourth metal layer over the third dielectric layer.

FIG. 4j shows the pixel after the subsequent processing step of depositing and patterning a fourth metal layer 185 over ILD3 layer 180. Fourth metal layer 185 is, for example, electrically coupled to third metal layer 175 through conductive contacts through ILD3 layer 180.

Figure 4K:
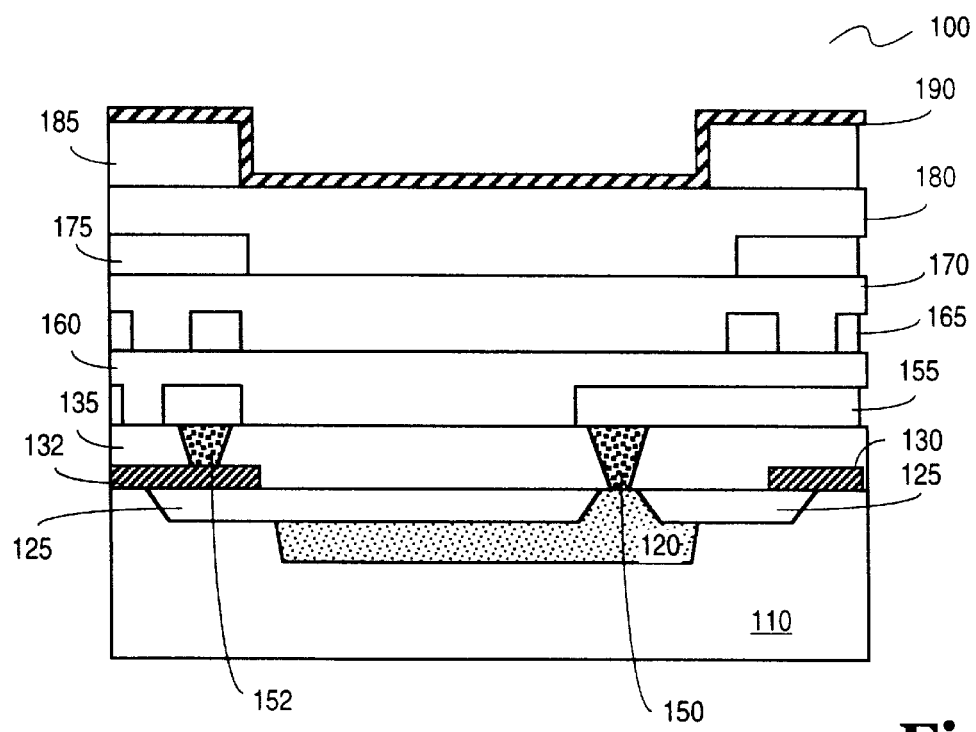
FIG. 4k shows the pixel of FIG. 4a after the subsequent processing step of depositing a passivation layer over the fourth metal layer.

FIG. 4k shows the pixel after the subsequent processing step of depositing a passivation layer 190 over fourth metal layer 185. Passivation layer 190 is, for example, silicon nitride ($Si_3N_4$) conformally deposited to a thickness of approximately 7500 angstroms (Å). Silicon nitride is chosen as the final dielectric/passivation layer in this embodiment because of its ability to resist penetration or attack by moisture or elements such as sodium.

Overlying the photosensing portion of the pixel in the semiconductor substrate are interlayer dielectrics ILD0–ILD3 layers 135, 160, 170, and 180. A conventional dielectric for these layers is a silicon glass. Accordingly, ILD0–ILD3 layers are transmissive to light, i.e., White light, in the visible spectrum. Similarly, passivation layer 190 of silicon nitride is completely transmissive to light, White light, in the visible spectrum.

Figure 4L:
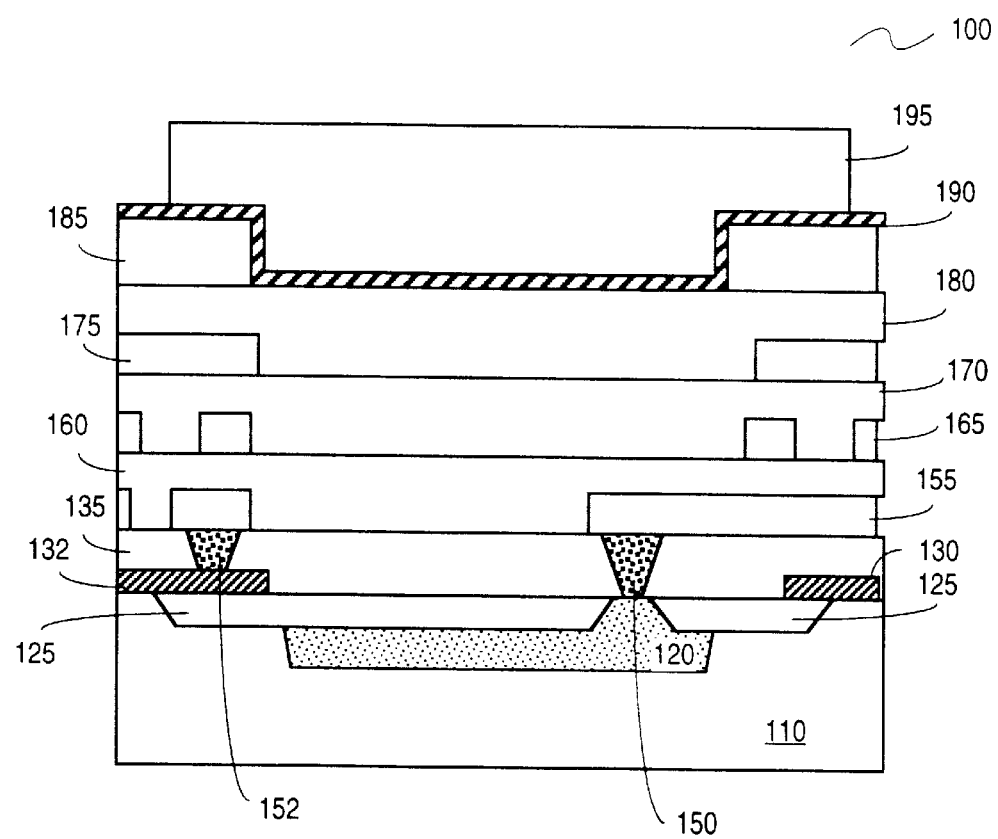
FIG. 4l shows the pixel of FIG. 4a after the subsequent processing step of depositing a color filter array material over the pixel.

FIG. 4*l* shows the pixel after the subsequent processing step of depositing a color filter material, such as for example a Orange, Green, or Blue CFA material 195, over silicon nitride passivation layer 190. CFA material 195 includes filter material selective to light having, for example, a wavelength corresponding to the Orange region of the visible spectrum. In other words, only light selective to light having a wavelength corresponding to the Orange region of the visible spectrum will pass through Orange CFA material 195.

Suitable materials for CFA material in accordance with the invention, such as Orange CFA material 195 include, but are not limited to, pigmented acrylates, dyed photoresist such as a Novolack resin, and dyed polyimides. The benefits of pigmented polymers such as polymers pigmented according to color representations PO42 or PO43 or a mixture of PO42 and PO43 were noted above. In the case of a pigmented acrylate, the material 195 is conformally spun over passivation layer 190 across the top of a wafer containing the sensor array including pixel 100. Pigmented acrylate layer 195 is patterned by exposing areas over the wafer where desired pixels for the Orange selective light are to be located. Acrylate layer 195 is then exposed to light, such as for example ultraviolet light, to cross-link or polymerize the acrylate. After exposure, the layer is sprayed with a developer and the non-polymerized portion is washed away leaving Orange light selective areas 195 over the desired pixels of the array(s) of the wafer.

To complete the OGB color system of the invention, the process described above with respect to the Orange CFA material is repeated with color filter material sensitive to light having a wavelength corresponding to the Green region of the visible spectrum. The process is then repeated with color filter material sensitive to light having a wavelength corresponding to the Blue region of the visible spectrum. It is to appreciated that the invention illustratively presented a deposition process involving the deposition and patterning of the Orange, Green, and Blue CFA materials in that order. The illustration is not intended to limit the invention or the process of forming the invention to that particular deposition order or technique.

Figure 5:
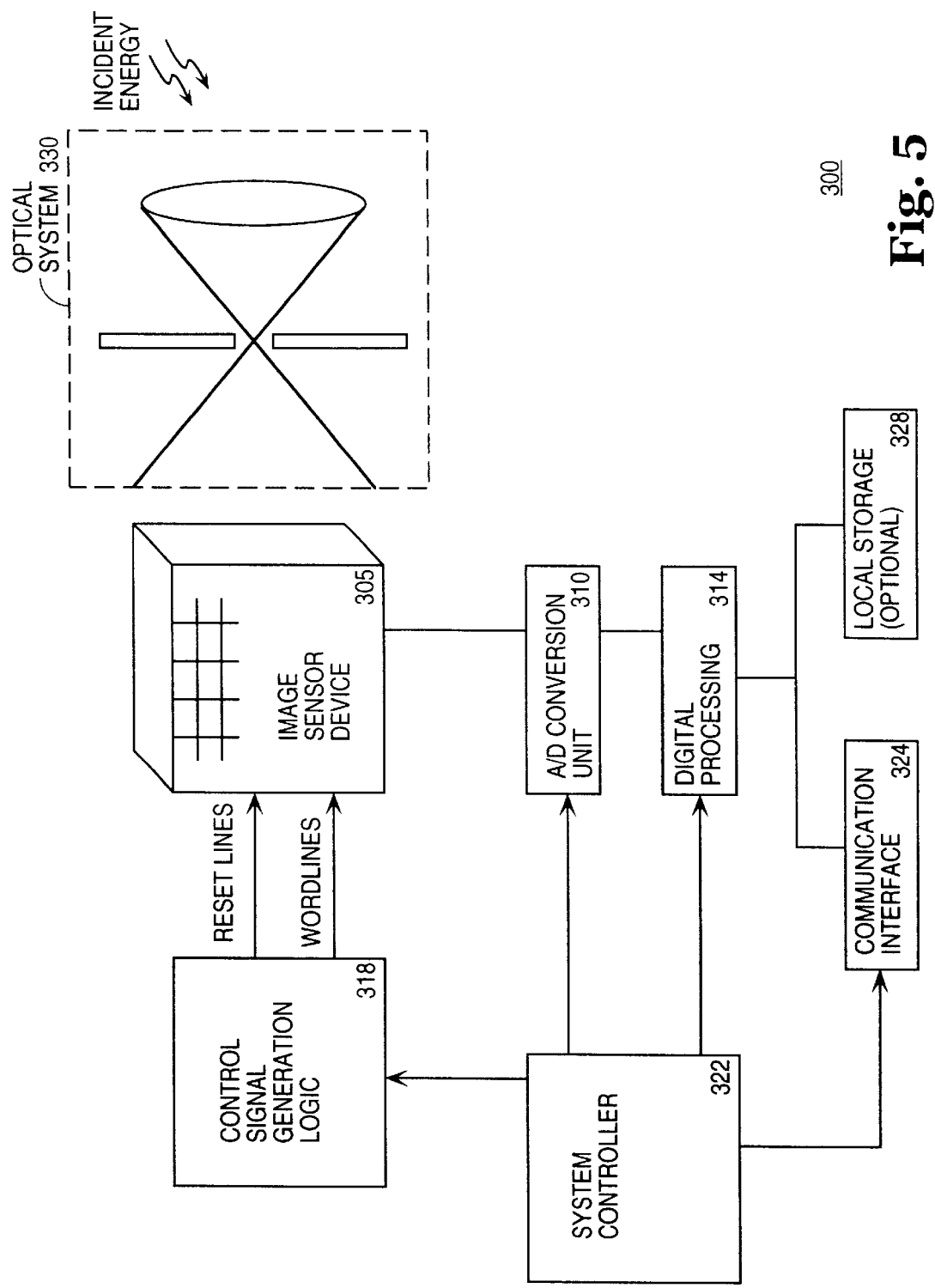
FIG. 5 shows an imaging system incorporating an image sensing device according to the invention.

The image sensing device incorporating an OGB color system described above may be used as part of a digital imaging system 300 shown in FIG. 5. Imaging system 300 has an optical system 330 that channels the incident energy, being light in this case, to create an optical image on image sensing device 305. Control signal generation logic 318 is provided to generate the reset signals in word lines needed to control photo sensors of the image sensor of image sensing device 305. The output values (sensor signals) may be further processed in analog form before being fed to an analog-to-digital (A/D) conversion unit 310 that in turn feeds digital processing block 313. Analog signal processing, the A/D unit, and portions of the digital processing block may be located on the same die as the sensor array. The digital processing may include hard-wired logic and/or a programmed processor that performs a variety of digital functions, including preparing digital image data based on the sensor signals for storage or transmission.

Transmission of the image data to an external processing system may be accomplished using communication interface 324. For instance, as a digital camera, system 300 will contain a communication interface that implements a computer peripheral bus standard such as universal series bus (USB) or IEEE 1394–1995. Imaging system 300 may also contain local storage 328 of the non-volatile variety, for instance including a solid state memory such as a removable memory card, a rotating magnetic device, or other suitable memory device for permanent storage of digital image data. The operation of system 300 may be orchestrated by system controller 322 which may include a conventional microcontroller responding to instructions stored as firmware.

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A color imaging device comprising an array of light selective elements, including a first light selective element sensitive to light having a wavelength corresponding to orange, a second light selective element sensitive to light having a wavelength corresponding to green, and a third light selective element sensitive to light having a wavelength corresponding to blue, wherein each of the light selective elements describes a respective color space for only a light sensitive element associated with the light selective element.

2. The device of claim 1, wherein the first, second, and third light selective elements occur in a repeating pattern in the array.

3. The device of claim 1, wherein over a major portion of the array, the second light selective element occurs at every other element position along both of two orthogonal directions.

4. The device of claim 1, wherein the light selective elements are arranged in a substantially rectangular pattern and the first light selective element and the third light selective element alternate with the second light selective element.

5. The device of claim 1, wherein said first light selective element comprises a polymer and a pigment of one of PO42 and PO43.

6. A color image sensor comprising:
an array of light sensitive elements; and
an array of light selective elements overlying the array of light sensitive elements, the array of light selective elements including a first light selective element sensitive to light having a wavelength corresponding to orange, a second light selective element sensitive to light having a wavelength corresponding to green, and a third light selective element sensitive to light having a wavelength corresponding to blue, wherein each of the light selective elements describes a respective color space for only a light sensitive element associated with the light selective element.

7. The sensor of claim 6, wherein the first, second, and third light selective elements occur in a repeating pattern in the array.

8. The sensor of claim 6, wherein over a major portion of the array of light selective elements, the second light selective element occurs at every other element position along both of two orthogonal directions.

9. The sensor of claim 6, wherein the light selective elements of the array are arranged in a substantially rectangular pattern and the first light selective element and the third light selective element alternate with the second light selective element.

10. An imaging system comprising:
an imaging sensor having:
an array of light sensitive elements, and
an array of light selective elements overlying the array of light sensitive elements, the array of light selective elements including a first light selective element sensitive to light having a wavelength corresponding to orange, a second light selective element sensitive to light having a wavelength corresponding to green, and a third light selective element sensitive to light having a wavelength corresponding to blue, wherein each of the light selective elements describes a respective color space for only a light sensitive element associated with the light selective element;
control circuitry configured to generate control signals for controlling said imaging sensor; and
signal processing circuitry for generating image data in response to the sensor signals.

11. The imaging system of claim 10, wherein the first, second, and third light selective elements of the imaging sensor occur in a repeating pattern in the array.

12. The imaging system of claim 10, wherein over a major portion of the array of light selective elements of the imaging sensor, second light selective element occurs at every other element position along both of two orthogonal directions.

13. The imaging system of claim 10, wherein the light selective elements of the imaging sensor are arranged in a substantially rectangular pattern and the first light selective element and the third light selective element alternate with the second light selective element.

14. The device of claim 1, wherein the array of light selective elements consists of elements sensitive to light having a wavelength corresponding to orange, green, and blue.

15. The sensor of claim 6, wherein the array of light selective elements consists of elements sensitive to light having a wavelength corresponding to orange, green, and blue.

16. The imaging system of claim 10, wherein the array of light selective elements consists of elements sensitive to light having a wavelength corresponding to orange, green, and blue.

* * * * *

UNITED STATES PATENT AND TRADEMARK OFFICE
CERTIFICATE OF CORRECTION

PATENT NO. : 6,771,314 B1  Page 1 of 1
DATED : August 3, 2004
INVENTOR(S) : Bawolek et al.

It is certified that error appears in the above-identified patent and that said Letters Patent is hereby corrected as shown below:

Column 1,
Line 36, delete "calorimetrically" and insert -- colorimetrically --.

Signed and Sealed this

Seventh Day of December, 2004

JON W. DUDAS
*Director of the United States Patent and Trademark Office*